United States Patent [19]
Zucker et al.

[11] Patent Number: 6,107,887
[45] Date of Patent: Aug. 22, 2000

[54] DIFFERENTIAL TO SINGLE-ENDED VIDEO CABLE DRIVER HAVING BICMOS CURRENT-MODE OPERATIONAL AMPLIFIER

[75] Inventors: Robert Zucker; Carlos A. Laber, both of Los Altos; David Ritter, San Jose, all of Calif.

[73] Assignee: Micro Linear Corporation, San Jose, Calif.

[21] Appl. No.: 09/165,699

[22] Filed: Oct. 2, 1998

[51] Int. Cl.⁷ .............................. H03F 3/04; H03F 3/68; H03F 3/16
[52] U.S. Cl. .................... 330/301; 330/295; 330/300
[58] Field of Search .................................. 330/252, 295, 330/300, 301

[56] References Cited

U.S. PATENT DOCUMENTS

| | | | |
|---|---|---|---|
| 4,371,843 | 2/1983 | Fang et al. | 330/253 |
| 4,555,673 | 11/1985 | Huijsing et al. | 330/258 |
| 4,595,883 | 6/1986 | Nakayama | 330/255 |
| 4,661,779 | 4/1987 | Okamoto | 330/253 |
| 4,701,718 | 10/1987 | Wrathall et al. | 330/253 |
| 4,730,168 | 3/1988 | Senderowicz et al. | 330/253 |
| 4,897,611 | 1/1990 | Laber et al. | 330/253 |
| 5,001,441 | 3/1991 | Gen-Kuong | 330/294 |
| 5,028,882 | 7/1991 | Marrah et al. | 330/254 |
| 5,091,701 | 2/1992 | Butler | 330/252 |
| 5,146,152 | 9/1992 | Jin et al. | 323/280 |
| 5,218,319 | 6/1993 | Takimoto | 330/257 |
| 5,365,161 | 11/1994 | Inoue et al. | 323/282 |
| 5,559,470 | 9/1996 | Laber et al. | 330/252 |
| 5,774,020 | 6/1998 | Kimura | 330/252 |
| 5,777,514 | 7/1998 | Mittal et al. | 330/253 |

OTHER PUBLICATIONS

Gray, Paul R., and Meyer, Robert G., *Analysis and Design of Analog Integrated Circuits*, Third Ed., 1993, pp. 471–472.
Laber, et al., "Design Considerations for a High–Performance 3–um CMOS Analog Standard–Cell Library," IEEE Journal of Solid State Circuits, vol. SC–22, No. 2, Apr. 1987, pp. 181–189.

*Primary Examiner*—Robert Pascal
*Assistant Examiner*—Patricia T. Nguyen
*Attorney, Agent, or Firm*—Haverstock & Owens LLP

[57] ABSTRACT

A two-stage differential to single-ended amplifier. The input stage converts a differential voltage to a differential current. A first pair of bipolar input transistors are biased with constant currents. Therefore, their on-resistance does not affect gain linearity. Changes in input voltages induce currents in a first pair of field effect transistors (FETs) each having a gate coupled to the collector of a corresponding input transistor and a drain coupled to the emitter of the corresponding input transistor. Differential currents are provided to the output stage by a second pair of FETs, each configured to mirror the current in a corresponding one of the first pair of FETs. Gain is adjustable by enabling additional pairs of FETs configured as current mirrors. The output stage includes a second pair of bipolar transistors with bases coupled together and biased with equal currents. Currents from the input stage are applied to the emitters of the second pair of bipolar transistors. A third pair of FETs are coupled to the second pair of bipolar transistors forming a current mirror which tends to equalize the currents from the input stage. A current representative of a sum of currents from the input stage is forced through a resistor, forming the output voltage. The output voltage DC level is adjusted by controlling the voltage at the bases of the second pair of bipolar transistors.

17 Claims, 8 Drawing Sheets

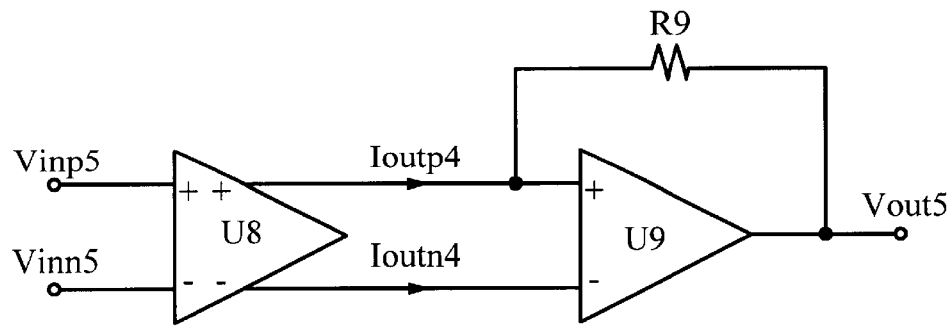
*Figs.* 6
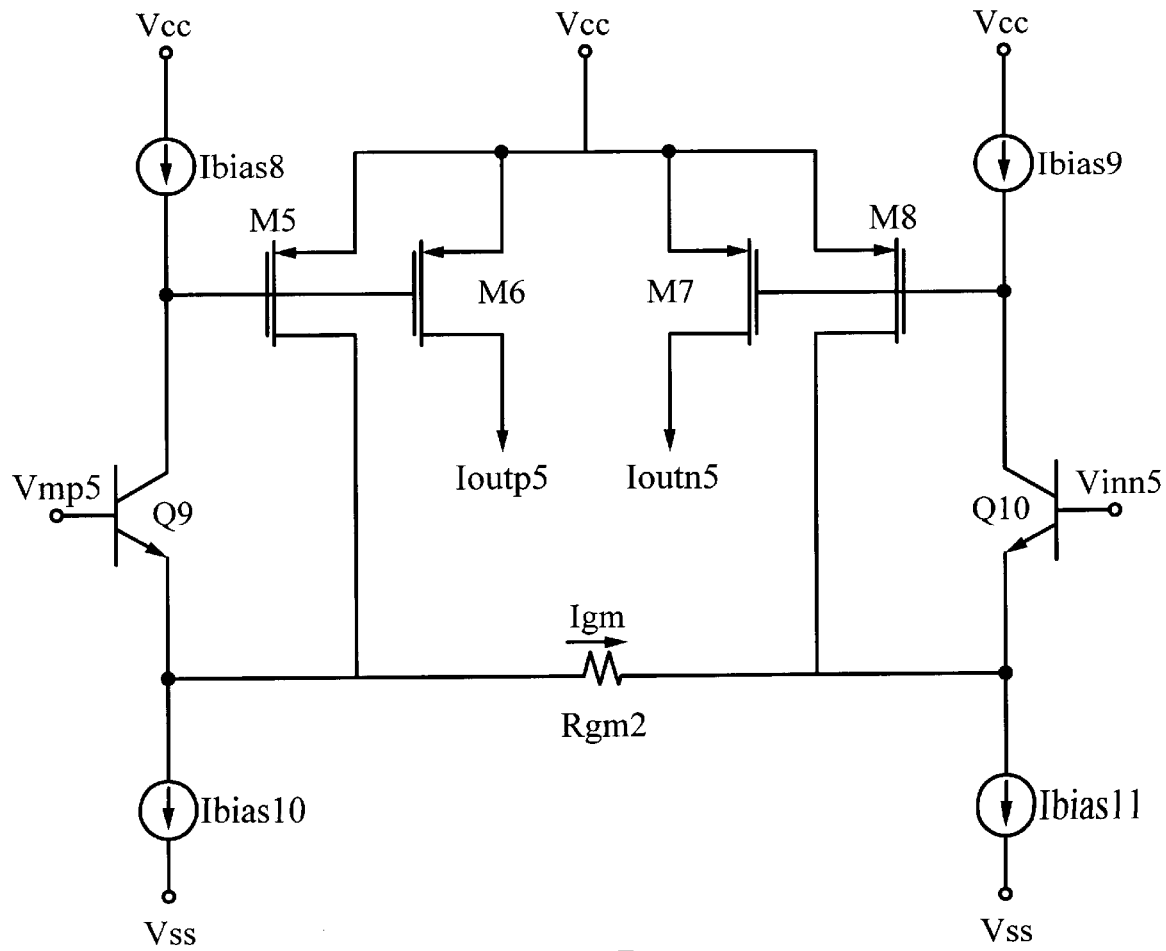
*Fig.* 7 (PRIOR ART)

DIFFERENTIAL TO SINGLE-ENDED VIDEO CABLE DRIVER HAVING BICMOS CURRENT-MODE OPERATIONAL AMPLIFIER

FIELD OF THE INVENTION

The invention relates to the field of amplifier circuits. More particularly, the invention relates to the field of differential input to single-ended amplifier circuits for driving video cables.

BACKGROUND OF THE INVENTION

Circuits utilized for transmitting video signals over video cables should to be able to convert the video signals into a form suitable for driving 75 ohm or 150 ohm video cables with a high degree of accuracy, should perform a differential input voltage to single-ended output voltage conversion and should provide an appropriate quiescent DC output voltage.

A conventional circuit for performing differential to single-ended conversion is illustrated in FIG. 1. A differential input voltage is applied across the terminals Vinn1 and Vinp1. The terminal Vinn1 is coupled to a non-inverting input of an operational amplifier U1. An output of the operational amplifier U1 is coupled to a first terminal of a resistor R1 and to a first terminal of a resistor R2. A second terminal of the resistor R2 is coupled to a first terminal of a resistor R3 and to an inverting input of the operational amplifier U1. A second terminal of the resistor R3 is coupled to an inverting input of an operational amplifier U2 and to a first terminal of a resistor R4. A non-inverting input of the operational amplifier U2 is coupled to the terminal Vinp1. An output of the operational amplifier U2 is coupled to a second terminal of the resistor R4 and to a first terminal of a resistor R5. A second terminal of the resistor R5 is coupled to a first terminal of a resistor R6 and to an non-inverting input of an operational amplifier U3. A second terminal of the resistor R6 is coupled to a reference voltage Vref1. A second terminal of the resistor R1 is coupled to a first terminal of a resistor R7 and to an inverting input of the operational amplifier U3. An output of the operational amplifier U3 is coupled to a second terminal of the resistor R7 and to a terminal Vout1. A single-ended output voltage is formed at the node Vout1.

The circuit illustrated in FIG. 1 has a disadvantage in that it requires three separate operational amplifiers U1, U2 and U3, each of which can contribute to offset errors, signal distortion, and supply injection errors. The circuit illustrated in FIG. 1 is also subject to common-mode errors, particularly when the output stage resistors are not perfectly matched. Generally, a large input stage gain is required to minimize the common-mode gain sensitivity of the output stage. Gain accuracy can be poor, however, as several resistors must track each other.

Another circuit of the prior art for performing differential to single-ended conversion is illustrated in FIG. 2. A differential voltage is applied across the terminals Vinp2 and Vinn2. The terminal Vinp2 is coupled to a non-inverting input of a differential input to differential output transconductance amplifier U4. The terminal Vinn2 is coupled to an inverting input of the transconductance amplifier U4. A non-inverted output of the transconductance amplifier U4 is coupled to a non-inverting input of a current differencing amplifier U5. An inverted output of the transconductance amplifier U4 is coupled to an inverting input of the current differencing amplifier U5. An output of the current differencing amplifier U5 is coupled to an inverting input of an operational amplifier U6 and to a first terminal of a resistor R8. A non-inverting input of the operational amplifier U6 is coupled to a reference voltage Vref2. A output of the operational amplifier U6 is coupled a second terminal of the resistor R8 and to a terminal Vout2. A single-ended voltage is formed at the terminal Vout2.

The circuit illustrated in FIG. 2 has a drawback in that differential input to differential output transconductance amplifiers, such as the transconductance amplifier U4, often have poor gain accuracy and poor gain linearity due the emitter resistance of bipolar transistors utilized in the amplifier, as explained below with reference to FIG. 3. This effect can be offset somewhat by increasing biasing currents in the input stage of the transconductance amplifier U4, however, this results in higher power consumption and higher power dissipation. Further, current differencing amplifiers, such as the current differencing amplifier U5, generally utilize an asymmetrical set of current mirrors. Such current mirrors can introduce Early voltage effects, other systematic errors, and non-systematic matching errors.

A schematic diagram of a prior art differential input to differential output transconductance amplifier, such as the transconductance amplifier U4, is illustrated in FIG. 3. A supply node Vcc, is coupled to a source of a PMOS transistor M1, to a source of a PMOS transistor M2, to a source of a PMOS transistor M3 and to a source of a PMOS transistor M4. A drain of the transistor M1 is coupled to a gate of the transistor M1, to a gate of the transistor M2 and to a collector of an npn bipolar transistor Q1. A drain of the transistor M4 is coupled to a gate of the transistor M4, to a gate of the transistor M3 and to a collector of an npn bipolar transistor Q2. An emitter of the transistor Q1 is coupled to a first terminal of a bias current source Ibias1 and to a first terminal of a resistor Rgm1. An emitter of the transistor Q2 is coupled to a first terminal of a bias current source Ibias2 and to a second terminal of the resistor Rgm1. The input terminal Vinp2 is coupled to a base of the transistor Q1 and the input terminal Vinn2 is coupled to a base of the transistor Q2. A second terminal of the bias current source Ibias1 and a second terminal of the bias current source Ibias2 are coupled to the ground node.

An output current Ioutp2 is formed at a drain of the transistor M2 and an output current Ioutn2 is formed at a drain of the transistor M3. The transistor Q1 and Q2 act as voltage followers. The collector current in the transistor Q1 is mirrored by the transistors M1 and M2 to form the output current Ioutp2. The collector current in the transistor Q2 is mirrored by the transistors M3 and M4 to form the output current Ioutn2. An ac differential in the input voltages results in an ac differential in the output currents.

Ideally, for a differential input to differential output transconductance amplifier, the differential output currents are given the $\pm igm=(Vinp2-Vinn2)/Rgm1$. In the circuit illustrated in FIG. 3, however, due to the small signal $r_e$ of Q1 and Q2, the actual differential output currents are given by $\pm igm=(Vinnp2-Vinn2)/(Rgm1+2r_e)$. The resistance $r_e$ is the emitter resistance of each of the transistors Q1 and Q2, which varies inversely with the current through each of the transistors Q1 and Q2. Therefore, the gain of the amplifier illustrated in FIG. 3 is non-linear because the emitter resistances $r_e$ change with the load currents into Rgm1 which transit through the transistors Q1 and Q2, and, thus, the emitter resistances $r_e$ change with the input voltages. The effect of changes in $r_e$ can be reduced by significantly increasing the device sizes and bias currents. This is not an entirely satisfactory solution, however, because large device sizes require significant silicon space and high bias currents result in increased power consumption and increased power dissipation in the amplifier.

FIG. 4 illustrates a schematic diagram of a prior art Norton amplifier with feedback. An input terminal Iinn3 is coupled to a base of an npn bipolar transistor Q3, to an anode of a diode D1 and to a first terminal of a resistor R9. An input terminal Iinp3 is coupled to a base of an npn bipolar transistor Q4 and to a collector of the transistor Q3. A supply node Vcc is coupled to a first terminal of a current source Ibias3. A second terminal of the current source Ibias3 is coupled to a collector of the transistor Q4, to an output terminal Vout4 and to an input terminal of a unity gain, inverting amplifier U7. A second terminal of the resistor R9 is coupled to an output of the amplifier U7 and to an output terminal Vout3. A cathode of the diode D1, an emitter of the transistor Q3 and an emitter of the transistor Q4 are coupled to a supply node Vss.

The amplifier illustrated in FIG. 4 forms a single-ended output voltage vout3 at the output terminal Vout3 given by: vout3=(iinp3−iinn3)(R9) where iinp3 and iinn3 are ac currents applied to the terminals Iinp3 and Iinn3, respectively. This circuit has a drawback in that it has an asymmetrical architecture and requires base currents for each of the transistors Q3 and Q4. As a result, the output voltage vout3 can include common-mode errors and the gain of the circuit tends to be non-linear. In addition, this architecture is somewhat inflexible because the input terminals Inn3 and Inp3 are held at one base-emitter junction voltage above the level of Vss and the output voltage vout3 has a quiescent value that is approximately one base-emitter junction voltage above the level of Vss. Further, base-emitter junction voltages vary with bias current, which can adversely affect the output voltage vout3.

FIG. 5 illustrates a schematic diagram of an input stage of a prior art current mode feedback operational amplifier. A supply node Vcc is coupled to a collector of an npn bipolar transistor Q5, to a first terminal of a bias current source Ibias4 and to a first terminal of a bias current source Ibias6. An emitter of the transistor Q5 is coupled to a first terminal of a bias current source Ibias5 and to a base of a pnp bipolar transistor Q6. A second terminal of the current source Ibias5 is coupled to a supply node Vss. A second terminal of the bias current source Ibias6 is coupled to an emitter of a pnp bipolar transistor Q7 and to a base of an npn bipolar transistor Q8. An emitter of the transistor Q8 is coupled to a first terminal of a bias current source Ibias7, to a second terminal of the bias current source Ibias4, to an emitter of the transistor Q6 and to an input terminal Iinn4. A collector of the transistor Q7 and a second terminal of the bias current source Ibias 7 are coupled to the supply node Vss. A base of the transistor Q5 and a base of the transistor Q7 are coupled to an input terminal Iinp4. A collector of the transistor Q6 is coupled to an output terminal Ioutn4 and a collector of the transistor Q8 is coupled to an output terminal Ioutp4.

The complementary push-pull emitter-followers of FIG. 5 tend to force any input currents applied to the terminals Iinp4 and Iinn4 to be equal. Any difference between the input currents results in a pair of differential output currents at the terminals Ioutn 4 and Ioutp4. The output currents can be coupled to an output stage (not shown) to form an output voltage. The amplifier illustrated in FIG. 5 suffers from a drawback in that it is limited to a relatively small input signal range and its practicality is limited because its manufacture requires a fully complementary bipolar process.

SUMMARY OF THE INVENTION

An object of the present invention is to provide a differential to single-ended amplifier circuit suitable for driving video cables and that overcomes disadvantages of prior circuits.

Another object of the present invention is to provide a differential to single-ended amplifier circuit that has good gain linearity and low phase distortion (particularly for video specifications commonly known as 'differential gain' and 'differential phase') and that also has high current output, wide bandwidth, and low common mode gain.

Yet another object of the present invention is to provide a differential to single-ended amplifier circuit that has precision gain control and an adjustable output DC reference level for adapting the amplifier circuit to drive either 75 ohm or 150 ohm video cabling from a single video input source.

Another object of the present invention is to provide a differential to single-ended amplifier circuit having an output current limiting function that does not induce oscillations or distortion in the output voltage of the amplifier.

Briefly, the invention is a novel differential input to single-ended output two-stage amplifier circuit including an input stage and an output stage. The input stage includes a differential voltage to differential current converter having selectively controllable gain. A first pair of bipolar input transistors (illustrated in FIG. 7 as Q9, Q10) are biased with currents that do not change with changes in the input voltages. Therefore, any variations in the emitter resistances of the input transistors does not adversely affect the gain linearity of the input stage. Changes in the input voltages induce currents in a first pair of field effect transistors (illustrated in FIG. 7 as M5, M8) each having a gate coupled to the collector of a corresponding input transistor and a drain coupled to the emitter of the corresponding input transistor. Differential currents (illustrated in FIG. 7 as Ioutp5, Ioutn5) are provided to the output stage by a second pair of field effect transistors (illustrated in FIG. 7 as M6, M7), each configured to mirror the current in a corresponding one of the first pair of field effect transistors. The gain of the input stage is adjustable by enabling additional parallel connected pairs of field effect transistors configured as current mirrors (for mirroring the currents in M5 and M8).

The output stage includes a novel implementation of a current-mode operational amplifier with active current limiting and a selectively adjustable output DC reference level setting. A second pair of bipolar transistors (illustrated in FIG. 8 as Q12, Q13) have their bases coupled to a reference voltage level and are biased with equal and constant biasing currents. The differential currents (illustrated in FIG. 8 as Iinp6 and Iinn6) supplied by the input stage are applied to the emitters of the second pair of bipolar transistors (Q12, Q13). A third pair of field effect transistors (illustrated in FIG. 8 as M9, M10) are coupled to the second pair of bipolar transistors (Q12, Q13) forming a current mirror. A first side (M9) of the current mirror absorbs any change in input current (Inp6) and reflects the change (to the emitter of Q13) through a second side of the current mirror (M10). Because the input currents (Inp6, Inn6) are equal and opposite in polarity (Inn6=−Inp6), the input current (Inn6) is also injected into the input transistor (Q13). By summing currents, it can be seen that a current (equal to 2*Inp6) flows through an output resistor (illustrated in FIG. 8 as R11) causing a change in a single-ended output voltage (at the terminal Vout6 illustrated in FIG. 8) of the amplifier (ΔVout6=2*Inp6*R11).

The DC level of the output voltage is set by adjusting the reference voltage level coupled to the bases of the second pair of bipolar transistors. This is accomplished by forming the reference voltage level by controlling a current through a reference resistor.

BRIEF DESCRIPTION OF THE DRAWINGS

FIG. 6 illustrates a block schematic diagram of a circuit according to the present invention for performing differential to single-ended conversion.

FIG. 7 illustrates a simplified schematic diagram of a differential input to differential output transconductance amplifier according to the present invention.

DESCRIPTION OF A PREFERRED EMBODIMENT OF THE INVENTION

FIG. 6 illustrates a block schematic diagram of a circuit according to the present invention for performing differential to single-ended conversion. An input terminal Vinp5 is coupled to a non-inverting input of a differential input to differential output transconductance amplifier U8. An input terminal Vinn5 is coupled to an inverting input of the transconductance amplifier U8. A non-inverted output of the transconductance amplifier U8 is coupled to a non-inverting input of a current mode operational amplifier U9 and to a first terminal of a feedback resistor R9. An inverted output of the transconductance amplifier U8 is coupled to an inverting input of the current mode operational amplifier U9. An output of the current mode operational amplifier U9 is coupled to a second terminal of the resistor R9 and to an output terminal Vout5.

Figure 1:
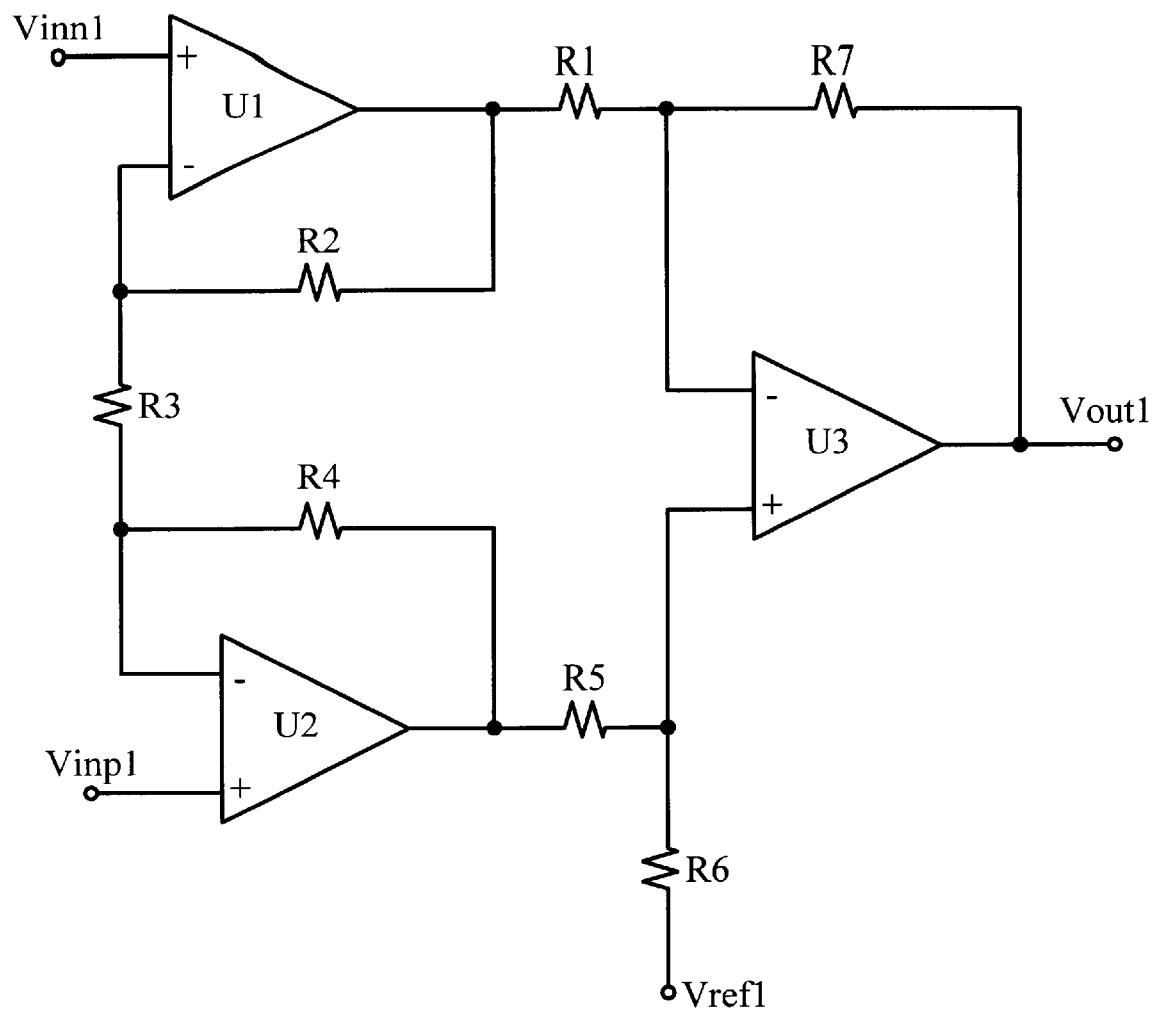
FIG. 1 illustrates a block schematic diagram of a first prior art circuit for performing differential to single-ended conversion.
Figure 2:
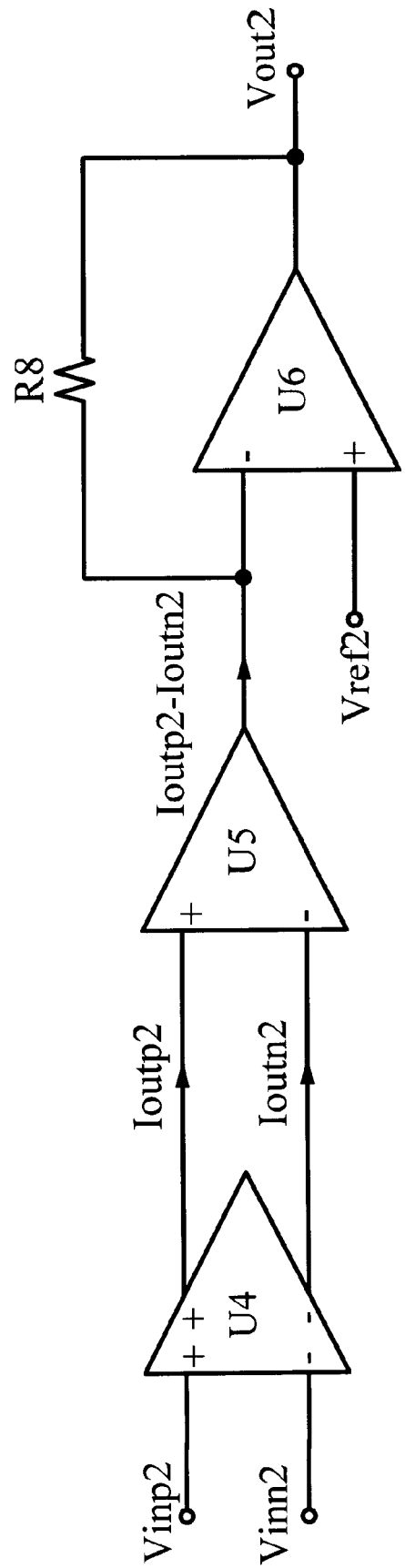
FIG. 2 illustrates a block schematic diagram of a second prior art circuit for performing differential to single-ended conversion.
Figure 3:
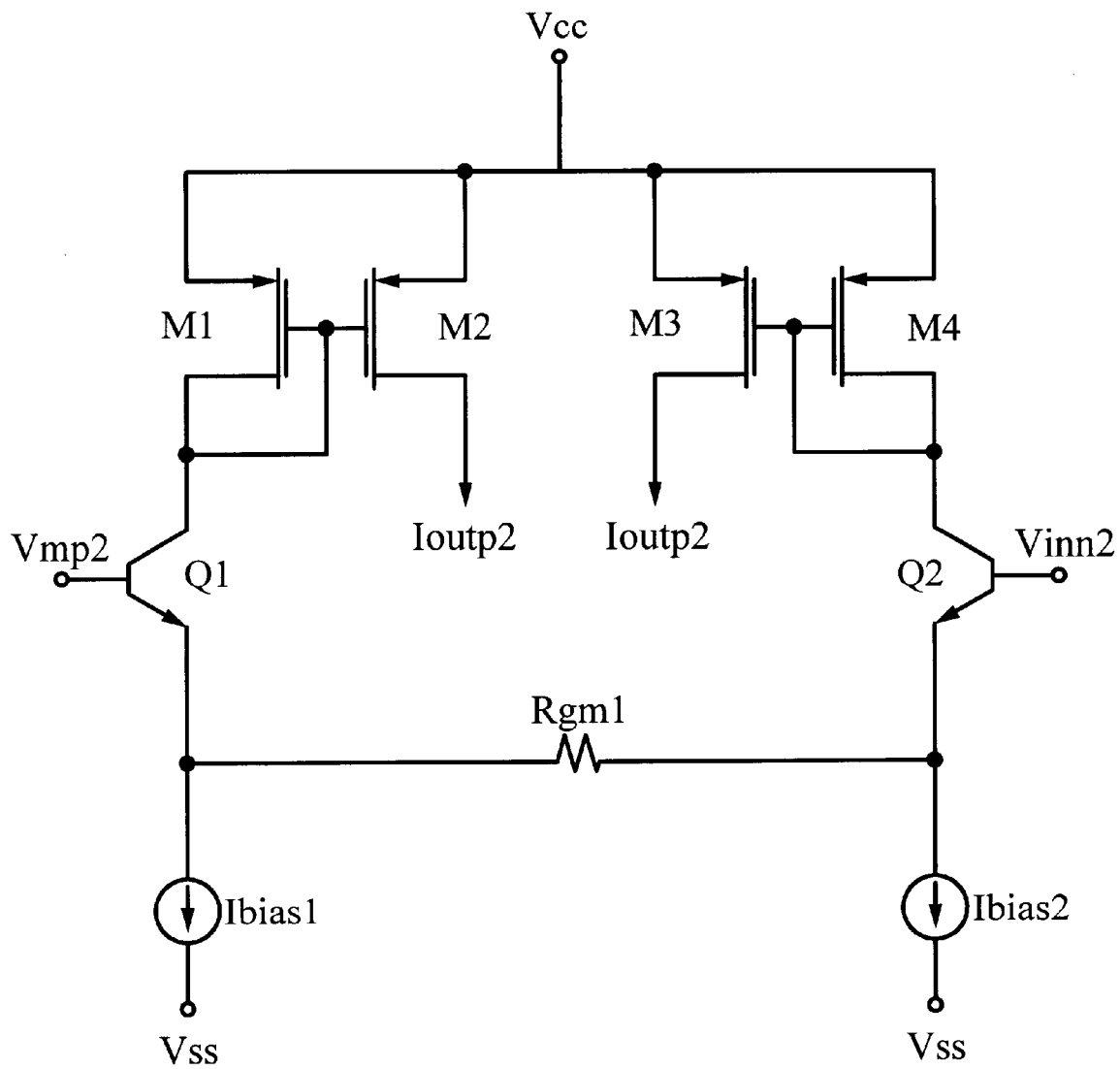
FIG. 3 illustrates a simplified schematic diagram of a prior art differential input to differential output transconductance amplifier.
Figure 4:
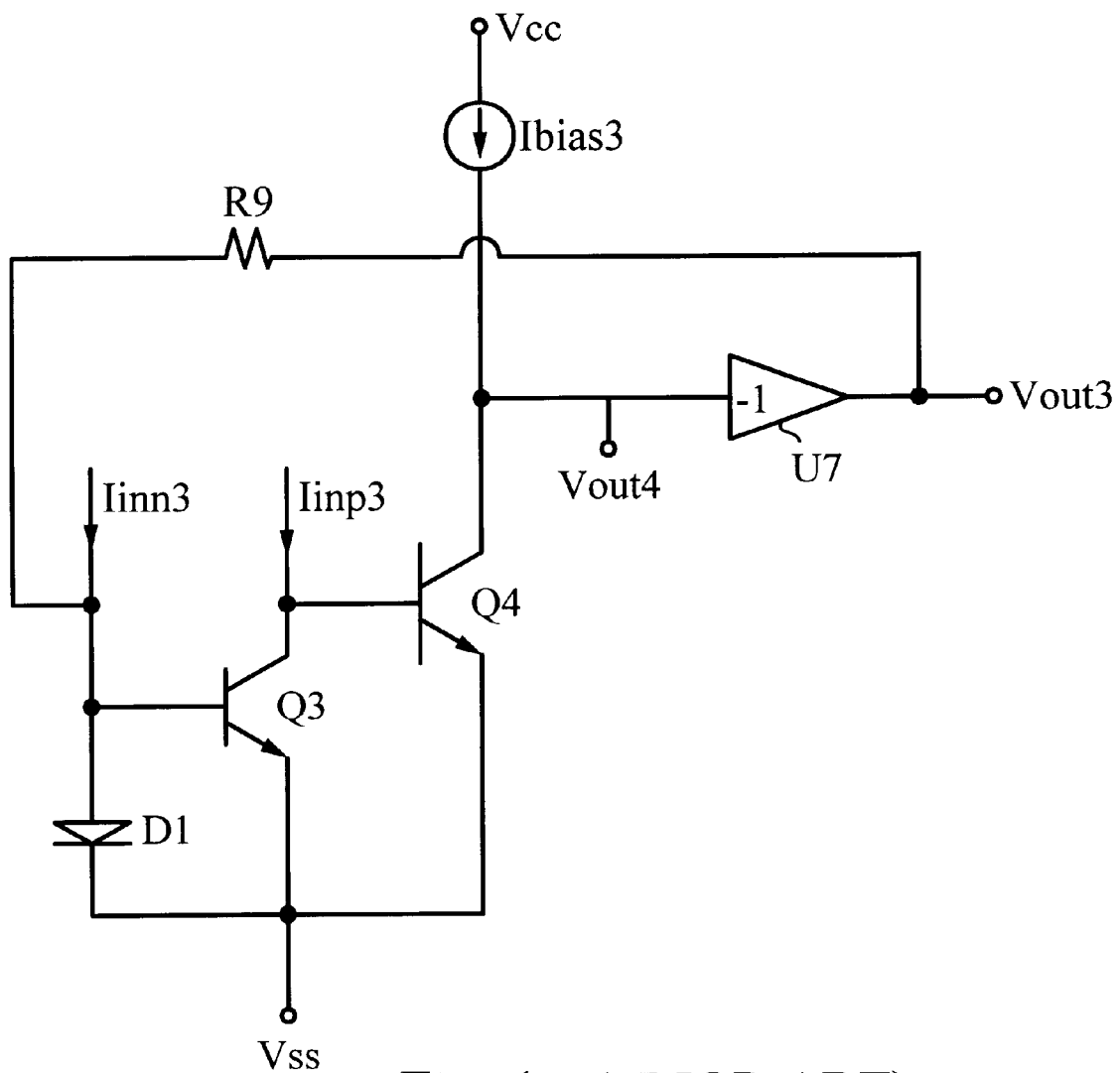
FIG. 4 illustrates a simplified schematic diagram of a prior art Norton amplifier with feedback.
Figure 5:
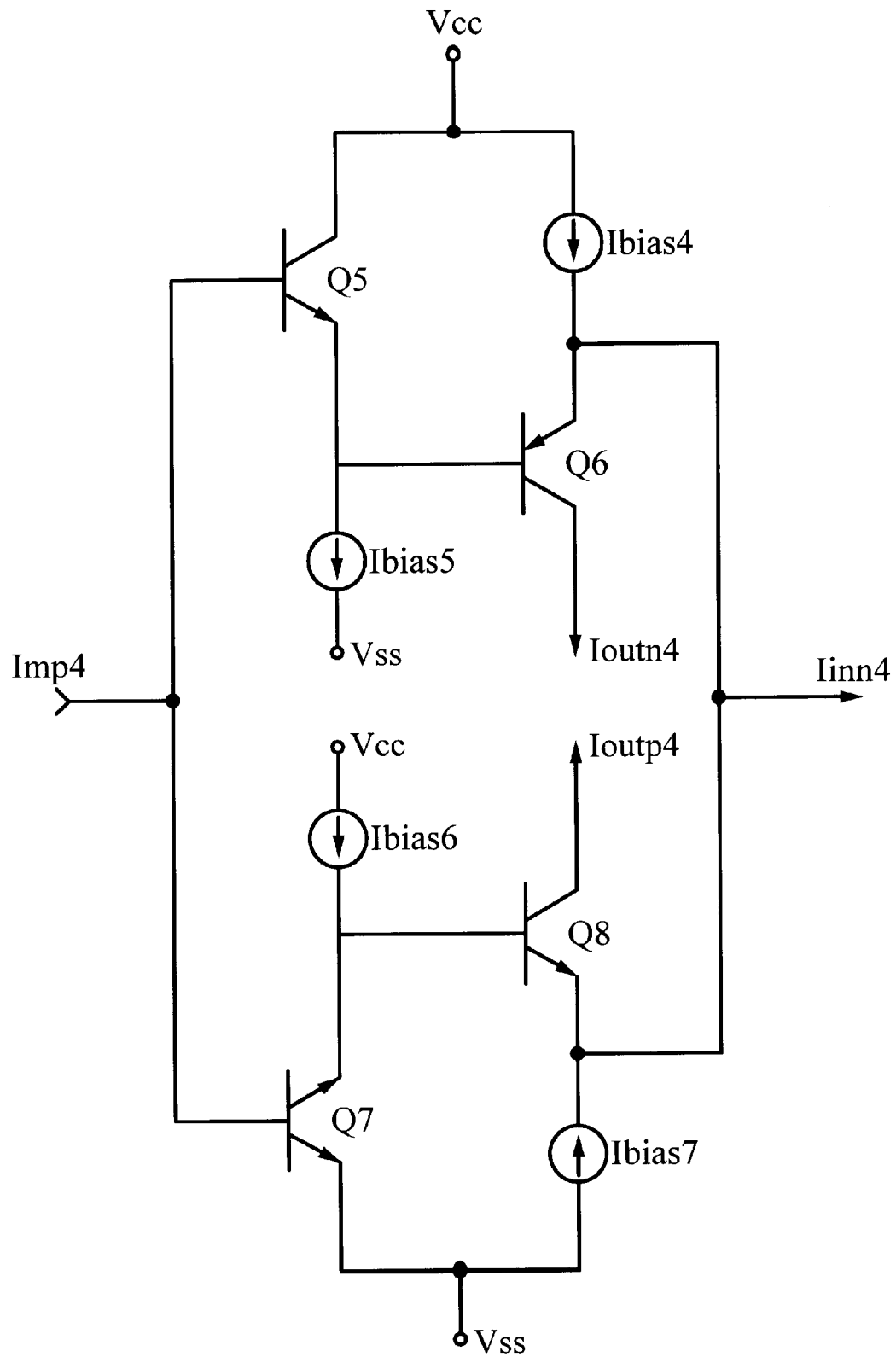
FIG. 5 illustrates a simplified schematic diagram of an input stage of a prior art current mode feedback operational amplifier.

Because the circuit illustrated in FIG. 6 utilizes a current-mode operational amplifier U9, which forms an output voltage based upon differential input currents, there is no need for a current differencing amplifier. This is in contrast to the prior art circuit illustrated in FIG. 2. Therefore, the circuit illustrated in FIG. 6 does not suffer from drawbacks associated with such a current differencing amplifier stage. In addition, the differential input to differential output transconductance amplifier U8 illustrated in FIG. 6 preferably includes features that are described in detail herein. These features contrast with the prior art transconductance amplifier U4 illustrated in FIGS. 2 and 3.

FIG. 7 illustrates a schematic diagram of the differential input to differential output transconductance amplifier according to the present invention. A supply node Vcc is coupled to a first terminal of a bias current source Ibias8, to a source of a PMOS transistor M5, to a source of a PMOS transistor M6, to a source of a PMOS transistor M7, to a source of a PMOS transistor M8 and to a first terminal of a bias current source Ibias9. A second terminal of the bias current source Ibias8 is coupled to a gate of the transistor M5, to a gate of the transistor M6 and to a collector of an npn bipolar transistor Q9. A second terminal of the bias current source Ibias9 is coupled to a gate of the transistor M7, to a gate of the transistor M8 and to a collector of an npn bipolar transistor Q10.

An emitter of the transistor Q9 is coupled to a drain of the transistor M5, to a first terminal of a resistor Rgm2 and to a first terminal of a bias current source Ibias10. A second terminal of the bias current source Ibias10 is coupled to a supply node Vss. An emitter of the transistor Q10 is coupled to a drain of the transistor M8, to a second terminal of the resistor Rgm2 and to a first terminal of a bias current source Ibias 11. A second terminal of the bias current source Ibias11 is coupled to the supply node Vss. A base of the transistor Q9 is coupled to the terminal Vinp5 and A base of the transistor Q10 is coupled to the terminal Vinn5. A drain of the transistor M6 is coupled to a terminal Ioutp5 and a drain of the transistor M7 is coupled to a terminal Ioutn5.

A differential voltage can be applied across the terminals Vinp5 and Vinn5 to produce a differential current from the nodes Ioutp5 and Ioutn5. The bias current sources Ibias8 and Ibias9 form constant currents. Therefore, the collector currents of the input bipolar transistors Q9 and Q10 are held constant. This substantially eliminates any non-linear effects that might otherwise be introduced if the collector currents were allowed to vary, as is the case for the transistors Q1 and Q2 illustrated in the prior art circuit of FIG. 3. Rather, the on-resistance $r_e$ of the transistors Q9 and Q10 is held nearly constant even when the differential input voltages and differential output currents vary. The differential current igm through the resistor Rgm2, however, is supplied by the transistors M5 and M8. Accordingly, the transconductance Gm2 of the transconductance amplifier illustrated in FIG. 7 is nearly independent of $r_e$ of the transistors Q9 and Q10, is linear over a wide range of input voltages, and can be given as $Gm2 \approx 1/Rgm2$.

Preferably, the bias current sources Ibias8 and Ibias9 provide equal currents and the bias current sources Ibias10 and Ibias11 provide equal currents. Further, the bias currents provided by the current sources Ibias8 and Ibias9 are preferably one-half of the level of the currents provided by the current sources Ibias10 and Ibias11. Therefore, by summing currents, it can be seen that the transistors M5 and M8 each provide a quiescent current that is substantially equal to one-half of the level of current provided by each of the current sources Ibias10 and Ibias11. It will be apparent, however, that other relationships between the bias currents can be practiced while achieving the benefits of the present invention.

An increase in the voltage at the terminal Vinp5 results in an increase in the current through the transistor M5, whereas a decrease in the voltage at the terminal Vinp5 results in a decrease in the current through the transistor M5. Further, an increase in the voltage at the terminal Vinn5 results in an increase in the current through the transistor M8, whereas a decrease in the voltage at the terminal Vinn5 results in a decrease in the current through the transistor M8. Accordingly, a voltage differential across the terminals Vinp5 and Vinn5 linearly results in a current igm through the resistor Rgm2 and differential output currents through the nodes Ioutp5 and Ioutn5.

Figure 8:
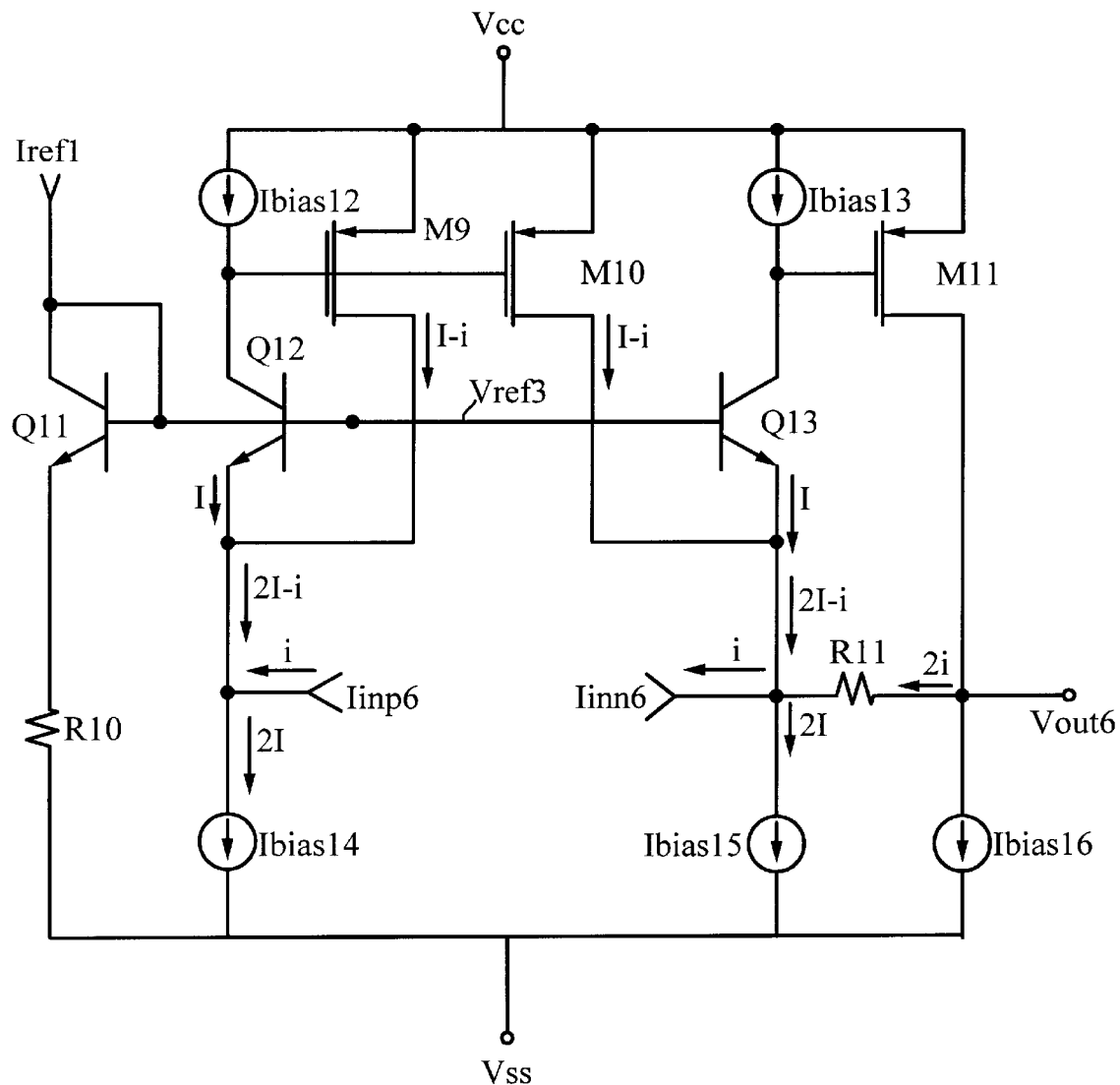
FIG. 8 illustrates a simplified schematic diagram of a differential input current to single-ended output voltage operational amplifier according to the present invention.

FIG. 8 illustrates a schematic diagram of a differential input current to single-ended output voltage operational amplifier according to the present invention (simplified current values are illustrated in FIG. 8). A supply node Vcc is coupled to a first terminal of a bias current source Ibias12, to a source of a PMOS transistor M9, to a source of a PMOS transistor M10, to a first terminal of a bias current source Ibias13 and to a source of a PMOS transistor M11. A second terminal of the bias current source Ibias12 is coupled to a gate of the transistor M9, to a gate of the transistor M10 and to a collector of an npn bipolar transistor Q12. A second terminal of the bias current source Ibias13 is coupled to a gate of the transistor M11 and to a collector of an npn bipolar transistor Q13. A reference current Iref1 is coupled to a collector of an npn bipolar transistor Q11, to a base of the transistor Q11, to a base of the transistor Q12 and to a base of the transistor Q13.

An emitter of the transistor Q11 is coupled to a first terminal of a resistor R10. An emitter of the transistor Q12 is coupled to a drain of the transistor M9, to a first terminal of a bias current source Ibias14 and to an input terminal Iinp6. An emitter of the transistor Q13 is coupled to a drain of the transistor M10, to a first terminal of a bias current source Ibias15, to an input terminal Iinn6 and to a first terminal of a resistor R11. A drain of the transistor M11 is coupled to a second terminal of the resistor R11, to a first terminal of a bias current source Ibias16 and to an output terminal Vout6. A second terminal of the resistor R10, a second terminal of the current source Ibias14, a second terminal of the current source Ibias15 and a second terminal of the current source Ibias16 are coupled to a supply node Vss.

Differential input currents Iinp6 and Iinn6 can be applied to the terminals Iinp6 and Iinn6. These differential input currents can be supplied by an amplifier, such as is illustrated in FIG. 7, or by another circuit. The transistors M9 and M10 form a current mirror which tends to maintain the input currents equal while a sum of the input currents are forced through the resistor R11, generating an output voltage at the terminal Vout6. A quiescent level of the voltage at the terminal Vout6 is adjustable by adjusting the level of the reference voltage Vref3 at the base of each of the transistors Q11, Q12 and Q13. This reference voltage level Vref3 is adjustable by adjusting the current Iref1 which flows through the resistor R10, forming the reference voltage Vref3 at the base of each of the transistors Q11, Q12 and Q13. The level of Vref is a base-emitter junction voltage of the transistor Q13 higher than the quiescent output voltage at the node Vout6.

Figure 9:
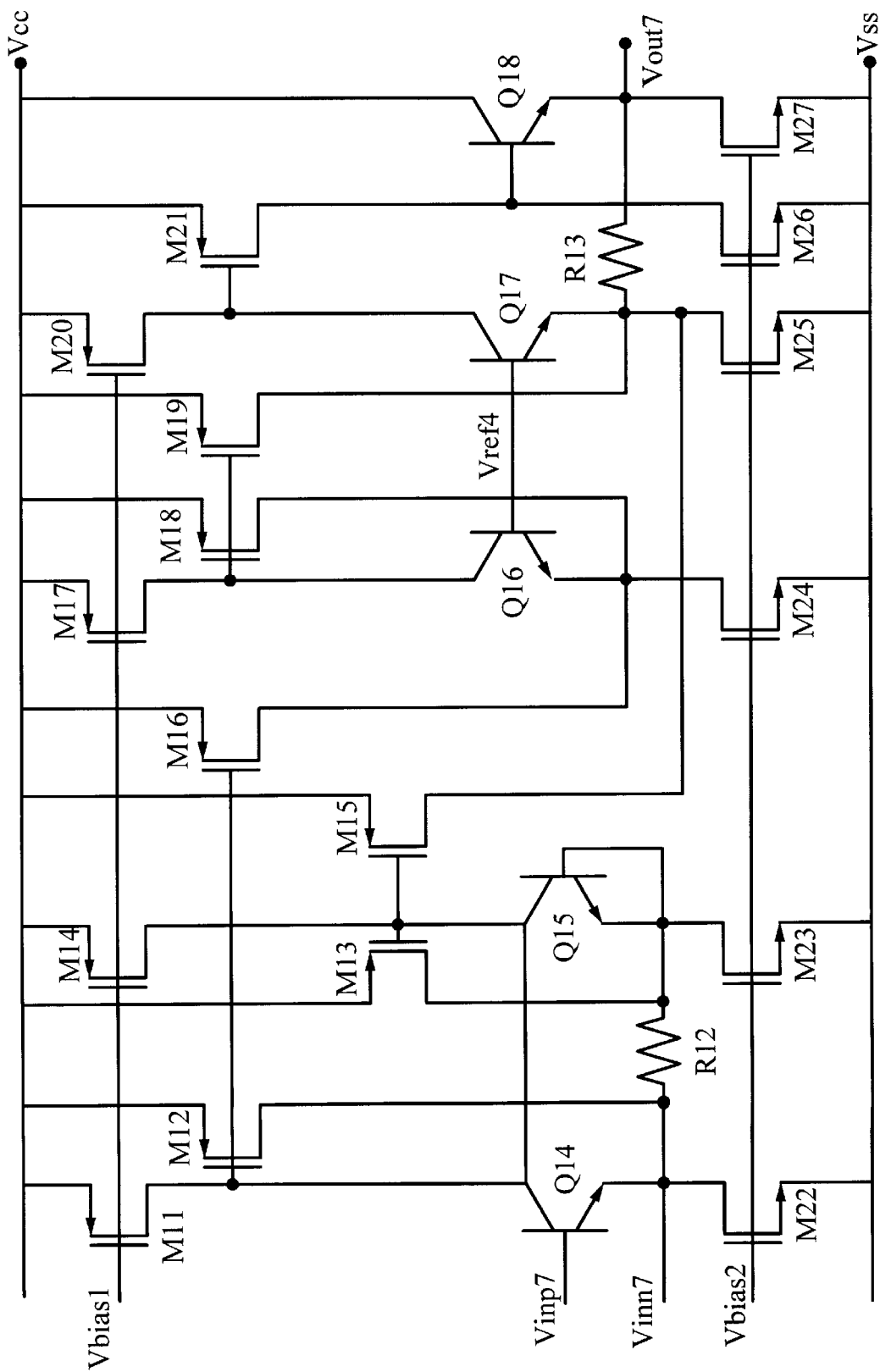
FIG. 9 illustrates a transistor-level schematic diagram of a differential input voltage to single-ended output voltage two-stage amplifier according to the present invention.

FIG. 9 illustrates a schematic diagram of a differential input voltage to single-ended output voltage two-stage amplifier according to the present invention. A supply node Vcc is coupled to a source of each of PMOS transistors M11–M21 and to a collector of an npn bipolar transistor Q18. A bias voltage Vbias1 is coupled to a gate of each of the transistors M11, M14, M17 and M20. A drain of the transistor M11 is coupled to a gate of the transistor M12, to a gate of the transistor M16 and to a collector of an npn bipolar transistor Q14. An input terminal Vinp7 is coupled to a base of the transistor Q14. An emitter of the transistor Q14 is coupled to a drain of the transistor M12, to a first terminal of a resistor R12 and to a drain of an NMOS transistor M22. A drain of the transistor M14 is coupled to a gate of the transistor M13, to a gate of the transistor M15 and to a collector of an npn bipolar transistor Q15. An input terminal Vinn7 is coupled to a base of the transistor Q15. An emitter of the transistor Q15 is coupled to a drain of the transistor M13, to a second terminal of the resistor R12 and to a drain of an NMOS transistor M23.

A drain of the transistor M17 is coupled to a gate of the transistor M18, to a gate of the transistor M19 and to a collector of an npn bipolar transistor Q16. A drain of the transistor M16 is coupled to an emitter of the transistor Q16, to a drain of the transistor M18 and to a drain of an NMOS transistor M24. A drain of the transistor M20 is coupled to a gate of the transistor M21 and to a collector of a bipolar transistor Q17. A base of the transistor Q16 and a base of the transistor Q17 are coupled to a bias voltage Vref4. A drain of the transistor M19 is coupled to an emitter of the transistor Q17, to a drain of the transistor M15, to a first terminal of a resistor R13 and to a drain of an NMOS transistor M25. A drain of the transistor M21 is coupled to a base of the transistor Q18 and to a drain of an NMOS transistor M26. An emitter of the transistor Q18 is coupled to a second terminal of the resistor R13, to an output terminal Vout7 and to a drain of an NMOS transistor M27. A gate of each of the transistors M22–M27 is coupled to a bias voltage Vbias2. A source of each of the transistors M22–M27 is coupled to a supply node Vss.

A differential voltage can be applied across the terminals Vinp7 and Vinn7. In response, a single-ended voltage is formed at the terminal Vout7. Therefore, the amplifier illustrated in FIG. 9 performs a differential voltage to single-ended voltage conversion. The amplifier illustrated in FIG. 9 includes an input stage that performs a differential voltage to differential current conversion similar to the amplifier illustrated in FIG. 7 and an output stage that performs a differential current to single-ended voltage conversion similar to the amplifier illustrated in FIG. 8. The quiescent value of the output voltage is adjustable by adjusting the level of Vref4.

The input stage illustrated in FIG. 9 includes Q14 corresponding to Q9 of FIG. 7; Q15 corresponding to Q10 of FIG. 7; R12 corresponding to Rgm of FIG. 7; M12 corresponding to M5 of FIG. 7; M13 corresponding to M8 of FIG. 7; M15 corresponding to M6 of FIG. 7; M16 corresponding to M7 of FIG. 7; M11 corresponding to Ibias8 of FIG. 7; M14 corresponding to Ibias9 of FIG. 7; and M22 corresponding to Ibias10 of FIG. 7 and M23 corresponding to Ibias11 of FIG. 7. In response to the differential input voltage applied across the terminals Vinp7 and Vinn7, differential currents are formed by the transistors M15 and M16. These differential currents provide driving signals for the output stage.

The output stage illustrated in FIG. 9 includes Q16 corresponding to Q12 of FIG. 8; Q17 corresponding to Q13 of FIG. 8; M18 corresponding to M9 of FIG. 8; M19 corresponding to M10 of FIG. 8; R13 corresponding to R11 of FIG. 8; M17 corresponding to Ibias12 of FIG. 8; M20 corresponding to Ibias13 of FIG. 8; M24 corresponding to Ibias14 of FIG. 8; and M25 corresponding to Ibias15 of FIG. 8. The output stage illustrated in FIG. 9 differs from the output stage illustrated in FIG. 8 in that the transistor M21 is provided for driving the base of the transistor Q18 and the emitter of the transistor Q18 is coupled to the second terminal of the resistor R13. The arrangement of M21 and Q18 takes advantage of the high current gain capability of the bipolar transistor Q18.

The architecture of the amplifier illustrated in FIG. 9 is highly symmetrical in the signal paths for each of the differential input signals until a final conversion to a single-ended output, which occurs due to the arrangement of the resistor R13. Therefore, the output voltage signal at the terminal Vout7 is substantially free from systematic errors. Further, Early voltage has almost no effect on gain accuracy, nor on offsets. Most dc inaccuracies that can occur are dependent upon a particular integrated circuit layout utilized to implement the amplifier, and, therefore, can be substantially eliminated through careful layout and device matching.

An amplifier circuit constructed according to the present invention is anticipated to be available as an output buffer/ cable driver in an integrated circuit precision video filter under part numbers ML6424 and ML6425 from Micro Linear Corporation, located at 2092 Concourse Drive, in San Jose, Calif. In the preferred embodiment of such output buffer/cable drivers, output current is limited by conventional methods including sampling the output current and, if the output current becomes excessive, reducing current driving capability of an output transistor.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

Specifically, it will be apparent to one of ordinary skill in the art that the device of the present invention could be implemented in several different ways and the apparatus disclosed above is only illustrative of the preferred embodiment of the invention and is in no way a limitation. For example, it would be within the scope of the invention to vary the values of the various components and voltage levels disclosed herein. In addition, it will be apparent that a transistor of one type, such as NMOS, PMOS, bipolar pnp or bipolar npn can be interchanged with a transistor of another type, and in some cases interchanged with a diode, with appropriate modifications to the remaining circuitry, and so forth.

What is claimed is:

1. An amplifier circuit comprising:
   a. a first stage for transforming a pair of differential input voltages into a pair of intermediate differential currents wherein the first stage includes a first bipolar transistor and a second bipolar transistor, each having a base and an emitter resistance, wherein the differential input voltages are applied across the bases of the first and second bipolar transistors and wherein the gain of the input stage is independent of the emitter resistances of the first and second bipolar transistors; and
   b. a second stage for transforming the pair of intermediate differential currents into a single-ended output voltage.

2. The amplifier circuit according to claim 1 wherein the second stage comprises means for selectively adjusting a quiescent level of the output voltage.

3. The amplifier circuit according to claim 1 wherein the first stage further comprises:
   a. a first field effect transistor wherein a gate of the first field effect transistor is coupled to a collector of the first bipolar transistor and a drain of the first field effect transistor is coupled to an emitter of the first bipolar transistor; and
   b. a second field effect transistor wherein a gate of the second field effect transistor is coupled to a collector of the second bipolar transistor and a drain of the second field effect transistor is coupled to an emitter of the second bipolar transistor.

4. An amplifier circuit comprising:
   a. a first stage for transforming a pair of differential input voltages into a pair of intermediate differential currents wherein the first stage includes a first bipolar transistor and a second bipolar transistor, each having a base and an emitter resistance, wherein the differential input voltages are applied across the bases of the first and second bipolar transistors and wherein the gain of the input stage is independent of the emitter resistances of the first and second bipolar transistors, the first stage further including a first field effect transistor wherein a gate of the first field effect transistor is coupled to a collector of the first bipolar transistor and a drain of the first field effect transistor is coupled to an emitter of the first bipolar transistor;
   b. a second field effect transistor wherein a gate of the second field effect transistor is coupled to a collector of the second bipolar transistor and a drain of the second field effect transistor is coupled to an emitter of the second bipolar transistor; and
   c. a second stage for transforming the pair of intermediate differential currents into a single-ended output voltage; and
   a first resistor wherein a first terminal of the first resistor is coupled to the drain of the first field effect transistor and a second terminal of the first resistor is coupled to the drain of the second field effect transistor.

5. The amplifier circuit according to claim 4 further comprising:
   a. a third field effect transistor coupled to the first field effect transistor, the third field effect transistor for forming a first current of the intermediate pair of differential currents by mirroring a current in the first field effect transistor; and
   b. a fourth field effect transistor coupled to the second field effect transistor, the fourth field effect transistor for forming a second current of the intermediate pair of differential currents by mirroring a current in the second field effect transistor.

6. The amplifier circuit according to claim 5 wherein a gate of the third field effect transistor is coupled to the gate of the first field effect transistor and a source of the third field effect transistor is coupled to a source of the first field effect transistor and wherein the first current of the intermediate pair of differential currents is provided to the second stage at the drain of the third field effect transistor and wherein a gate of the fourth field effect transistor is coupled to the gate of the second field effect transistor and a source of the fourth field effect transistor is coupled to a source of the second field effect transistor and wherein the second current of the intermediate pair of differential currents is provided to the second stage at the drain of the fourth field effect transistor.

7. The amplifier circuit according to claim 5 further comprising:
   a. a fifth field effect transistor coupled to the third field effect transistor, the fifth field effect transistor for selectively increasing a level of the first current of the intermediate pair of differential currents by mirroring a current in the third field effect transistor; and
   b. a sixth field effect transistor coupled to the fourth field effect transistor, the sixth field effect transistor for selectively increasing a level of the first current of the intermediate pair of differential currents by mirroring a current in the fourth field effect transistor.

8. The amplifier circuit according to claim 7 wherein a gain of the first stage is adjustable by selectively enabling the fifth and sixth field effect transistors.

9. The circuit according to claim 7 wherein the second stage comprises:
   a. a seventh field effect transistor coupled to receive the first current of the intermediate pair of differential currents; and
   b. a eighth field effect transistor coupled to mirror a current in the seventh field effect transistor.

10. The circuit according to claim 9 further comprising:
a. a third bipolar transistor having an emitter coupled to a drain of the seventh field effect transistor and a collector coupled to a gate of the seventh field effect transistor;
b. a fourth bipolar transistor having an emitter coupled to a drain of the eighth field effect transistor and a base coupled to a base of the third bipolar transistor;
c. a ninth field effect transistor coupled to receive the second current of the intermediate pair of differential currents and having a gate coupled to a collector of the fourth bipolar transistor; and
d. a second resistor having a first terminal coupled to an emitter of the fourth bipolar transistor and a second terminal coupled to a drain of the ninth field effect transistor, wherein the single-ended output voltage is formed at the second terminal of the second resistor.

11. The amplifier circuit according to claim 10 wherein a DC quiescent level of the output voltage is selectively adjustable by adjusting a level of voltage on the base of the third of the third and fourth bipolar transistors.

12. The circuit according to claim 9 further comprising:
a. a third bipolar transistor having an emitter coupled to a drain of the seventh field effect transistor and a collector coupled to a gate of the seventh field effect transistor;
b. a fourth bipolar transistor having an emitter coupled to a drain of the eighth field effect transistor and a base coupled to a base of the third bipolar transistor;
c. a ninth field effect transistor coupled to receive the second current of the intermediate pair of differential currents and having a gate coupled to a collector of the fourth bipolar transistor;
d. a fifth bipolar transistor having a base coupled to a drain of the ninth field effect transistor; and
e. a second resistor having a first terminal coupled to an emitter of the fourth bipolar transistor and a second terminal coupled to an emitter of the fifth bipolar transistor, wherein the single-ended output voltage is formed at the second terminal of the second resistor.

13. An amplifier circuit comprising:
e. a first stage for transforming a pair of differential input voltages into a pair of intermediate differential currents; and
f. a second stage for transforming the pair of intermediate differential currents into a single-ended output voltage wherein the second stage comprises:

(1) a first node coupled to receive a first current of the pair of intermediate differential currents;
(2) a second node coupled to receive a second current of the pair of intermediate differential currents;
(3) a first bipolar transistor, wherein an emitter of the first bipolar transistor is coupled to the first node;
(4) a third node coupled to a base of the first bipolar transistor;
(5) a second bipolar transistor wherein an emitter of the second bipolar transistor is coupled to the second node and wherein base of the second bipolar transistor is coupled to the third node; and
(6) a resistor where a first terminal of the resistor is coupled to the second node and wherein the single ended output voltage is formed at the second terminal of the resistor.

14. The amplifier circuit according to claim 13 wherein the second stage further comprises a circuit for selectively adjusting a voltage level of the third node.

15. The amplifier circuit according to claim 14 wherein the second stage further comprises a resistor, wherein a first terminal of the resistor is coupled to the second node and wherein the single ended output voltage is formed at the second terminal of the resistor.

16. The amplifier circuit according to claim 15 wherein the second stage further comprises:
a. a first field effect transistor, wherein a gate of the first field effect transistor is coupled to a collector of the first bipolar transistor and wherein a drain of the first field effect transistor is coupled to the first node; and
b. a second field effect transistor, wherein a gate of the second field effect transistor is coupled to the gate of the first field effect transistor and wherein a drain of the second field effect transistor is coupled to the second node.

17. The amplifier circuit according to claim 14 wherein the circuit for selectively adjusting a voltage level of the third node comprises:
a. a third bipolar transistor, wherein a base of the third bipolar transistor is coupled to the third node;
b. a resistor, wherein a first terminal of the resistor is coupled to an emitter of the third bipolar transistor and wherein a second terminal of the resistor is coupled to a ground node; and
c. a selectively adjustable current source coupled to the first terminal of the resistor for selectively adjusting a level of voltage formed across the resistor.

* * * * *

UNITED STATES PATENT AND TRADEMARK OFFICE
CERTIFICATE OF CORRECTION

PATENT NO. : 6,107,887

DATED : August 22, 2000

INVENTOR(S) : Zucker et al.

It is certified that error appears in the above-identified patent and that said Letters Patent is hereby correct as shown below:

IN THE CLAIMS

In column 11, line 16, insert subparagraph designation --d.-- at the beginning of the line.

In column 11, line 44, delete subparagraph designation "e." and insert --a.--.

In column 11, line 47, delete subparagraph designation "f." and insert --b.--.

Signed and Sealed this

Twenty-ninth Day of May, 2001

*Attest:*

NICHOLAS P. GODICI

*Attesting Officer*     *Acting Director of the United States Patent and Trademark Office*